(12) United States Patent
Tan et al.

(10) Patent No.: US 7,315,374 B2
(45) Date of Patent: Jan. 1, 2008

(54) REAL-TIME MONITORING OPTICALLY TRAPPED CARBON NANOTUBES

(75) Inventors: Shida Tan, Milpitas, CA (US); Yuegang Zhang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 474 days.

(21) Appl. No.: 10/876,429

(22) Filed: Jun. 24, 2004

(65) Prior Publication Data
US 2007/0268491 A1   Nov. 22, 2007

(51) Int. Cl.
| | |
|---|---|
| G01B 11/00 | (2006.01) |
| G01B 11/26 | (2006.01) |
| G01J 4/00 | (2006.01) |
| G01C 1/00 | (2006.01) |
| G01N 21/00 | (2006.01) |
| C01B 31/00 | (2006.01) |
| C01B 31/02 | (2006.01) |
| D01F 9/12 | (2006.01) |
| B01D 5/00 | (2006.01) |
| B01J 19/12 | (2006.01) |

(52) U.S. Cl. .................. 356/399; 356/138; 356/153; 356/337; 356/338; 356/342; 356/364; 204/157.22; 204/157.41; 423/445 R; 423/447.2; 977/842; 977/880; 977/881

(58) Field of Classification Search .............. None
See application file for complete search history.

(56) References Cited

U.S. PATENT DOCUMENTS 4,148,552 A * 4/1979 Suzuki et al. ............... 359/388

| | | | |
|---|---|---|---|
| 2002/0084410 A1* | 7/2002 | Colbert et al. | 250/306 |
| 2003/0183560 A1* | 10/2003 | Hannah | 209/579 |
| 2005/0122550 A1* | 6/2005 | Plewa et al. | 359/10 |
| 2005/0147373 A1* | 7/2005 | Zhang | 385/143 |
| 2006/0014375 A1* | 1/2006 | Ford et al. | 438/622 |

FOREIGN PATENT DOCUMENTS

| | | |
|---|---|---|
| WO | WO 99/13127 A | 3/1999 |
| WO | WO 2004/024428 A | 3/2004 |

OTHER PUBLICATIONS

Debjit Chattopadhyay, "A Route for Bulk Separation of Semiconducting from Metallic Single-Wall Carbon Nanotubes", J.AM. Chem. Soc. 2003, vol. 125, pp. 3370-3375.
M.S. Dresselhaus, "Single Nanotube Raman Spectroscopy", Accts. of Chem. Research, vol. 35, No. 12, 2002.
M.S. Dresselhaus, "Phonons in Carbon Nanotubes", Advances in Physics, 2000, vol. 49, No. 6, pp. 705-814.
H. Kataura, "Optical Properties of Single-Wall Carbon Nanotubes", Synthetics Metals 103 (1999), pp. 2555-2558.
R. Krupke, "Separation of Metallic From Semiconducting Single-Walled Carbon Nanotubes", www.sciencexpress.org/26June2003/page1/10.1126/science.1086534.

* cited by examiner

Primary Examiner—Gregory J. Toatley, Jr.
Assistant Examiner—Gordon J. Stock, Jr.
(74) Attorney, Agent, or Firm—Blakely, Sokoloff, Taylor & Zafman LLP

(57) ABSTRACT

An embodiment of the present invention is a technique to monitor carbon nanotubes (CNTs). A carbon nanotube (CNT) is manipulated in a fluid by a laser beam. An illuminating light from a light source is aligned along axis of the CNT to produce an optical response from the CNT. The CNT is monitored using an optical sensor according to the optical response.

38 Claims, 4 Drawing Sheets

REAL-TIME MONITORING OPTICALLY TRAPPED CARBON NANOTUBES

BACKGROUND

1. Field of the Invention

Embodiments of the invention relate to the field of semiconductor, and more specifically, to nanotechnology.

2. Description of Related Art

Carbon nanotubes are promising elements in nanotechnology. They are fullerene-related structures which consist of graphene cylinders. Carbon nanotubes can be functionalized (by attaching moieties to nanotubes) to increase their solubility in solvents and to control their affinity with other molecules or solid materials.

Current methods for analysis for carbon nanotubes focus mainly on the post experimental results. This technique is indirect and prone to many sources of uncertainties, leading to inadequate assessment of the real effect of the optical trapping of the carbon nanotubes. Currently, there is no efficient technique to monitor the movement of the carbon nanotubes in an optical trapping system in real-time.

BRIEF DESCRIPTION OF THE DRAWINGS

Embodiments of the invention may best be understood by referring to the following description and accompanying drawings that are used to illustrate embodiments of the invention. In the drawings.

DESCRIPTION

An embodiment of the present invention is a technique to monitor carbon nanotubes (CNTS) in real-time. A carbon nanotube (CNT) is manipulated in a fluid by a laser beam. An illuminating light from a light source is aligned along axis of the CNT to produce an optical response from the CNT. The CNT is monitored using an optical sensor according to the optical response.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

One embodiment of the invention monitors manipulation of single-walled carbon nanotubes (SWNTs) by optical trapping in real time. Instead of post experiment analysis, dark field optical microscope configuration is introduced for in-situ observation. The use of dark field optical microscope in monitoring the carbon nanotubes during the optical trapping process enables the evaluation of the trapping effect in real-time. The induced dipole moment in the carbon nanotubes under the external optical field orients the carbon nanotubes along the polarization field direction. Under a dark field optical microscope and illumination of a halogen lamp, the orientation of the carbon nanotubes can be identified from the Rayleigh scattering of the carbon nanotubes, hence the effect of optical trapping can be monitored real time.

Single-walled carbon nanotubes are about one nanometer (nm) in diameter and a few micrometers ($\mu$m) in length. One embodiment of the invention provides a method to observe or visualize the carbon nanotubes during optical sorting and manipulation, which allows real time feedback to the researchers. The advantages of one embodiment of the invention includes: (1) the ability to observe optically trapped CNTs in real-time, and (2) the ability to automate manipulations of CNTs using feedback information from the observed image information.

Figure 1:
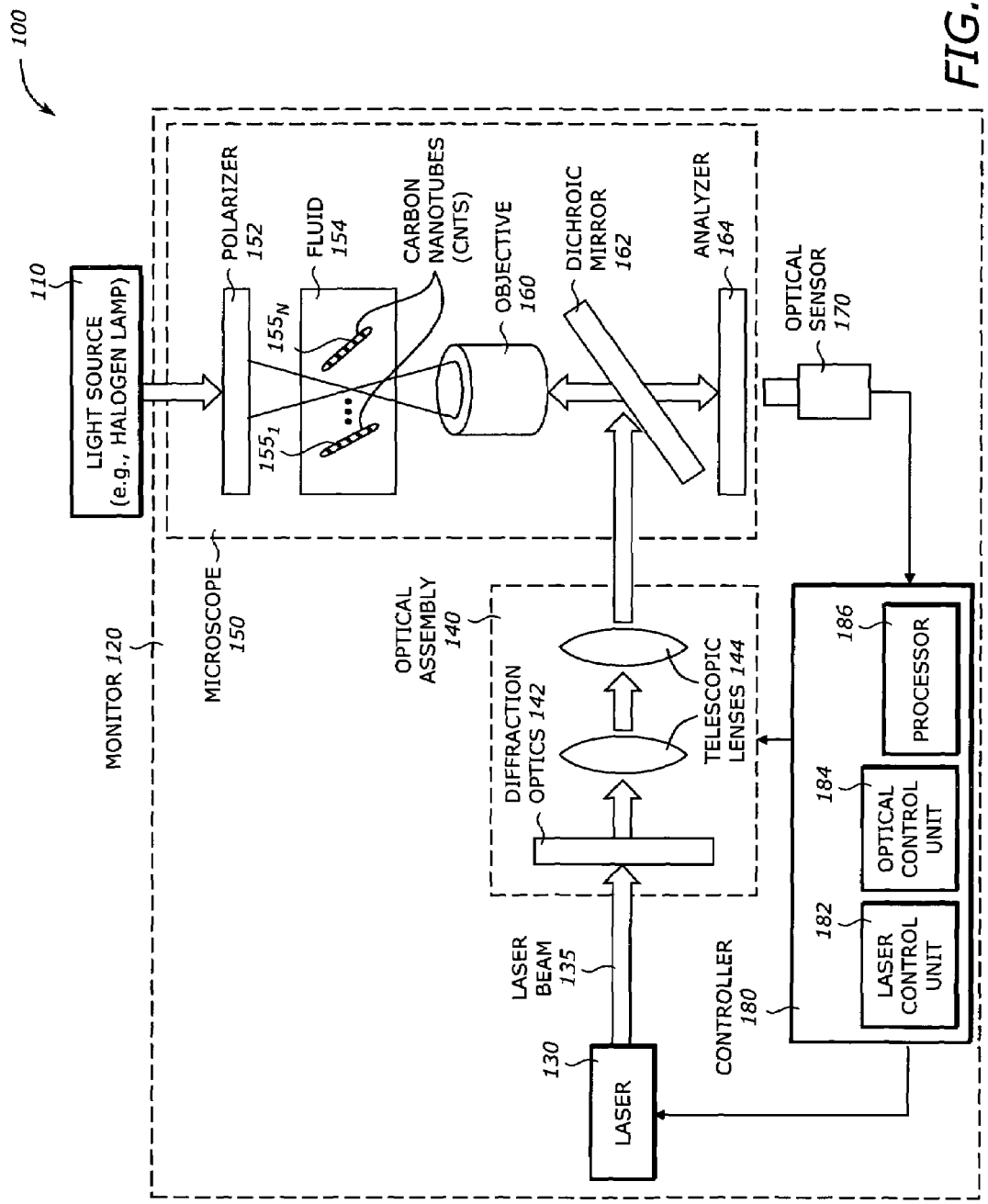
FIG. 1 is a diagram illustrating a system in which one embodiment of the invention can be practiced.

FIG. 1 is a diagram illustrating a system 100 in which one embodiment of the invention can be practiced. The system 100 includes a light source 110 and a monitor 120.

The light source is any light source suitable to generate an illuminating light to the monitor 120. In one embodiment, the light source is a halogen lamp with appropriate wattage. The light source intensity may be adjusted to provide proper illumination.

The monitor 120 monitors in real-time the position and movement of the optically trapped carbon nanotubes (CNTs). The monitor 120 includes a laser 130, an optical assembly 140, a microscope 150, an optical sensor 170, and a controller 180.

The laser 130 focuses a laser beam 135 to the microscope 150 through the optical assembly 140. The laser 130 may be controlled by the controller 180 to have a number of operating modes. It can be controlled to have varying intensities and optical frequencies. It may be polarized.

The optical assembly 140 provides optical elements to process the laser beam 135. Examples of the optical elements includes diffractive optics 142, lenses, telescopic lenses 144, optical modulators, and filters. The optical assembly 140 directs the laser beam 135 to a fluid 154 containing the CNTs $155_1$ to $155_N$ placed in the microscope 150.

The microscope 150 includes a polarizer 152, an objective 160, a dichroic mirror 162, and an analyzer 164. The microscope 150 may contain other elements. In one embodiment, the microscope 150 is configured to provide dark field microscopy. The dark field microscopy provides better visualization and/or enhanced images by creating contrast between the CNTs $155_1$ to $155_N$ and the surrounding field.

The polarizer 152 polarizes the illuminating light from the light source 110 by aligning the illuminating light along axis of a CNT to produce an optical response from the CNT. The Rayleigh scattering of the CNT becomes strong when light is polarized along the optical axis of the CNT. The optical response of the CNT is typically a green light.

The fluid 154 includes multiple layers or channels of different fluids. It may be contained in a fluidic channel or container made by glass or a polymeric material. The fluid 154 includes a number of CNTs $155_1$ to $155_N$. The CNTs may be single-walled CNTs (SWNTs) or multi-walled CNTs (MWNTs). The CNTs may be functionalized. The fluid 154 is placed between the polarizer 152 and the objective 160 to allow observation and monitoring the location or movement of the CNTs $155_1$ to $155_N$.

The dichroic mirror 162 reflects the laser beam through the objective 160 to the fluid 154 to manipulate the CNTs. It also provides an optical path to transmit the optical response as scattered by the CNTs to the analyzer 164. The analyzer 164 is another polarizer placed in the optical path between the rear aperture of the objective 160 and the observation tube (not shown) or the port where the optical sensor 170 is positioned.

The monitor 120 allows controlling and monitoring the CNTs in the fluid 154 in a number of ways. The controlling includes manipulation of the CNTs. The manipulation includes trapping a certain class of CNTs, moving a trapped CNT, releasing a trapped CNT, and aligning the trapped CNTs. The use of the laser 130 to manipulate the CNTs is based on the concept of optical dipole traps to be explained later.

The optical sensor 170 allows monitoring the CNTs according to the optical response. In one embodiment, the optical sensor 170 is a camera or a video recorder. The video or image information or signal is provided to the controller 180 for processing. The monitoring of the CNTs includes real-time observation of the optical response to determine the location, position, and movement of the CNTs. A human observer may observe the CNTs through the optical sensor 170 and perform necessary operations such as controlling the laser 130 manually or activating the controller 180.

The controller 180 controls the laser 130 using the video or image information provided by the optical sensor 170. It may perform the control functions automatically or semi-automatically by a human operation. The controller 180 includes a laser control unit 182, an optical control unit 184, and a processor 186.

The laser control unit 182 performs a number of control functions on the laser 130 to affect manipulating of the CNT based on one of intensity and movement of the observed optical response. These control functions may include, among others, varying frequency of the laser beam 135, changing position of focal point of the laser beam 135, turning off the laser beam 135, blocking the laser beam 135, filtering the laser beam 135 to reduce laser intensity, moving the laser beam 135 across a liquid-solid interface, and polarizing the laser beam 135.

The optical control unit 184 controls the optical assembly. The optical control operations may include movement and/or enabling/disabling of the diffractive optics, lenses, telescopic lenses, and filter. The use of the optical control unit 184 may also be optional and the optical control functions may be performed manually.

The processor 186 analyzes the image information of the CNTs in the fluid 154. It may include an image analyzer to track the optical response of a CNT and a decision logic to send a control signal to the laser control unit 182 and/or the optical unit 184 based on the optical response. For example, it may determine the intensity of the green light as scattered by the CNTs and provides a control signal to the laser control unit 182 to control the laser 130 such that the intensity of the CNTs is at some desirable level.

A focused laser beam can trap a neutral particle or molecule through the interaction between the electric field of the laser beam and the spontaneous dipole momentum induced in the particle or molecule. The induces dipole momentum of a neutral particle in the electric filed of a laser beam can be expressed as:

$$P = \epsilon_0 \chi E \quad (1)$$

where P is the polarization or dipole momentum per unit volume, $\epsilon_0$ is the permittivity of free space, $\chi$ is the dielectric susceptibility, and E is the electric field.

The potential energy may be expresses as:

$$U = (-1/2) \langle P \cdot E \rangle = (-1/2) \epsilon_0 \chi \langle E \rangle^2 \quad (2)$$

The dielectric susceptibility may be expressed in a complex form as a function of frequency as follows:

$$\chi(\omega) = \chi'(\omega) + i\chi''(\omega) \quad (3)$$

where $\chi'(\omega)$ is the real part and $\chi''(\omega)$ is the imaginary part.

When $\omega < \omega_0$, $\chi'(\omega) > 0$, where $\omega_0$ is a resonant frequency.

From equation (2), it is derived that the potential energy U decreases when the light intensity increases. Furthermore, the particle tends to move to an area of higher E and is trapped at the center of a laser beam, assuming that the optical intensity distribution of the laser beam is Gaussian.

Depending on the diameter and chirality, a SWNT may be metallic or semiconductor. The electron density of states of a SWNT is composed of many spikes, called the van Hove singularities. The energy gaps between the corresponding van Hove singularities are optically allowed inter-band transition energies. By choosing a proper laser frequency or continuously tuning the laser frequency, a certain type of nanotubes can be trapped. A MWNT is an assembly of multiple SWNTs with different diameters and chiralities. The trapping of a MWNT depends on its composition, i.e., ratio of different SWNT types. A laser frequency that can trap all types of SWNTs can also trap MWNTs.

The nanotubes can also be aligned using a polarized laser beam. The dipole is always parallel to the axis of the nanotube. The polarization P may be decomposed into a parallel component $P_p$ and an orthogonal component $P_o$:

$$P = P_p + P_o \approx P_p = \epsilon_0 \chi E_p \quad (4)$$

where $E_p$ is the parallel component of E.

The potential energy can then be expressed as:

$$U = (-1/2) \langle P \cdot E \rangle = (-1/2) \langle E_p \rangle^2 \cos \theta \quad (5)$$

where $\theta$ is the angle between E and the axis of a CNT.

From the above equations, an increase in E leads to a decrease in U. Also, a decrease in $\theta$ leads to a decrease in U when $\omega < \omega_0$, $\chi'(\omega) > 0$. Therefore, CNTs can be trapped and aligned by polarized laser beam.

Figure 2:
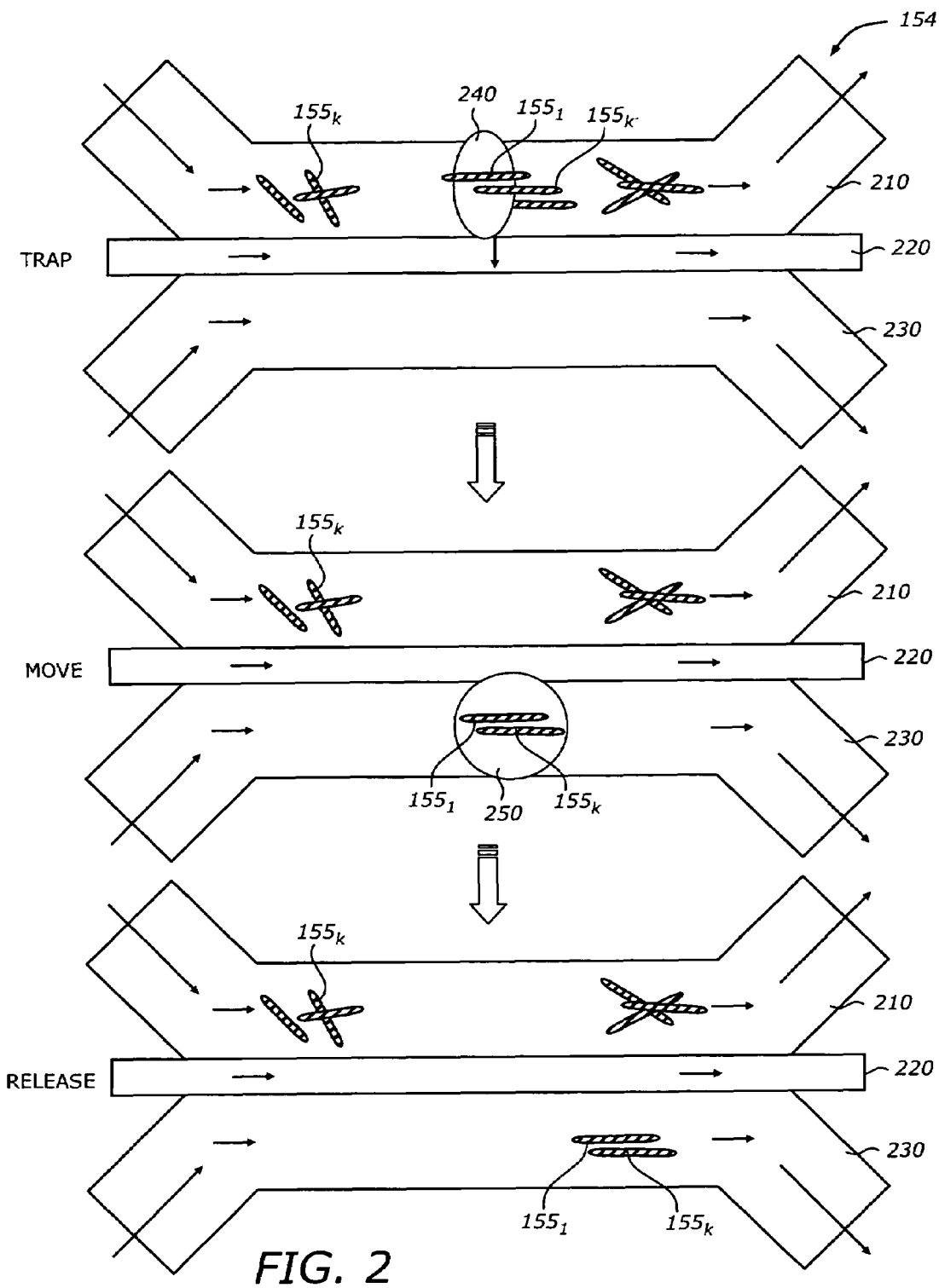
FIG. 2 is a diagram illustrating manipulation of CNTs according to one embodiment of the invention.

FIG. 2 is a diagram illustrating manipulation of CNTs according to one embodiment of the invention. The fluid 154 includes a first layer 210, a buffer layer 220, and a second layer 230.

The three layers 210, 220, and 230 are laminar flow layers. The buffer layer 220 prevents the random diffusion of the CNTs between the first and second layers 210 and 230. The first layer 210 contains a number of free CNTs $155_1$ to $155_N$.

The laser beam is focused to capture the CNT $155_k$ at the site 240 in the first layer 210. The laser beam is focused with a specific frequency, referred to as a trapping frequency, to selectively trap and/or release the CNT $155_k$ that is responsive to this trapping frequency. Once the CNT $155_k$ is trapped, it can be moved and released by controlling the laser beam.

To move the CNT $155_k$, the position of the focal point of the laser is changed from the site 240 to a site 250 in the second layer 230. The laser can be precisely moved and therefore the movement of the CNT $155_k$ can be precisely controlled. Once the CNT $155_k$ is moved to a new location, it can be released.

The trapped CNT $155_k$ can be released at either the first layer 210 or the second layer 230 at any location, e.g., the sites 240 or 250 using a number of methods. In the first method, the laser 110 is simply turned off, cutting off the laser beam. The electric field is removed and the CNT $155_k$ becomes free. In the second method, the laser beam is blocked, either by an optical or mechanical blocker. In the third method, the laser intensity is reduced by using a filter in the optical assembly 120 or in the laser 110 itself. In the fourth method, the frequency of the laser 110 is changed to be different than the trapping frequency. In the fifth method, the fluid at the second layer 230 is replaced with another fluid with different viscosity or dielectric constant from the first layer 210. In the sixth method, the laser beam moves across a liquid-solid interface (e.g. the wall of a microfluidic channel).

The trapping, moving, and release of the CNTs may be performed continuously by synchronizing the sweeping of the laser beam and the event of releasing the CNTs.

Figure 3:
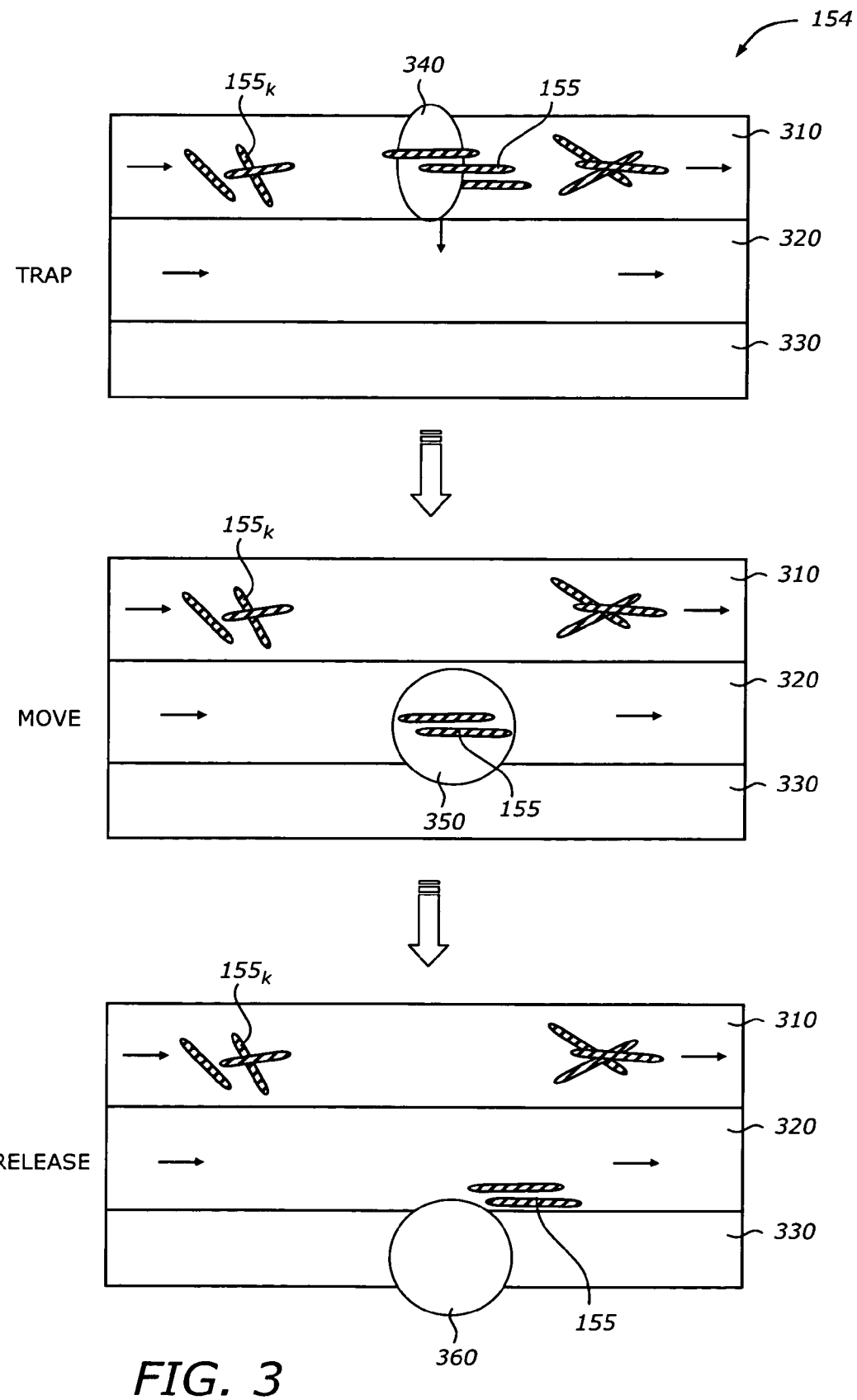
FIG. 3 is a diagram illustrating manipulation of CNTs using layers with different viscosities according to one embodiment of the invention can be practiced.

FIG. 3 is a diagram illustrating manipulation of CNTs using layers with different viscosities one embodiment of the invention can be practiced. The fluid 154 has three layers 310, 320, and 330.

The laser beam is focused to the CNTs in the first layer 310. The CNT 155 is optically trapped at a site 340. The trapped CNT 155 can be moved to the second layer 320 at a site 350 by moving the laser beam. Then, the trapped CNT 155 is released at the interface of the two laminar flow layers 320 and 330 with different viscosities, when the shear force on the CNT 155 due to the third layer 330 is larger than the laser trapping force.

The laser beam may sweep back and forth between the site 340 and a site 360 in the third layer 330 to trap, move, and release the CNT 155 at the interface between the second and third layers 320 and 330. This technique does not require a modulation of the laser intensity, or varying of frequency to release CNTs.

An extreme case in FIG. 3 is that the layer 330 is a solid (e.g. a wall of a microfluidic channel).

Figure 4:
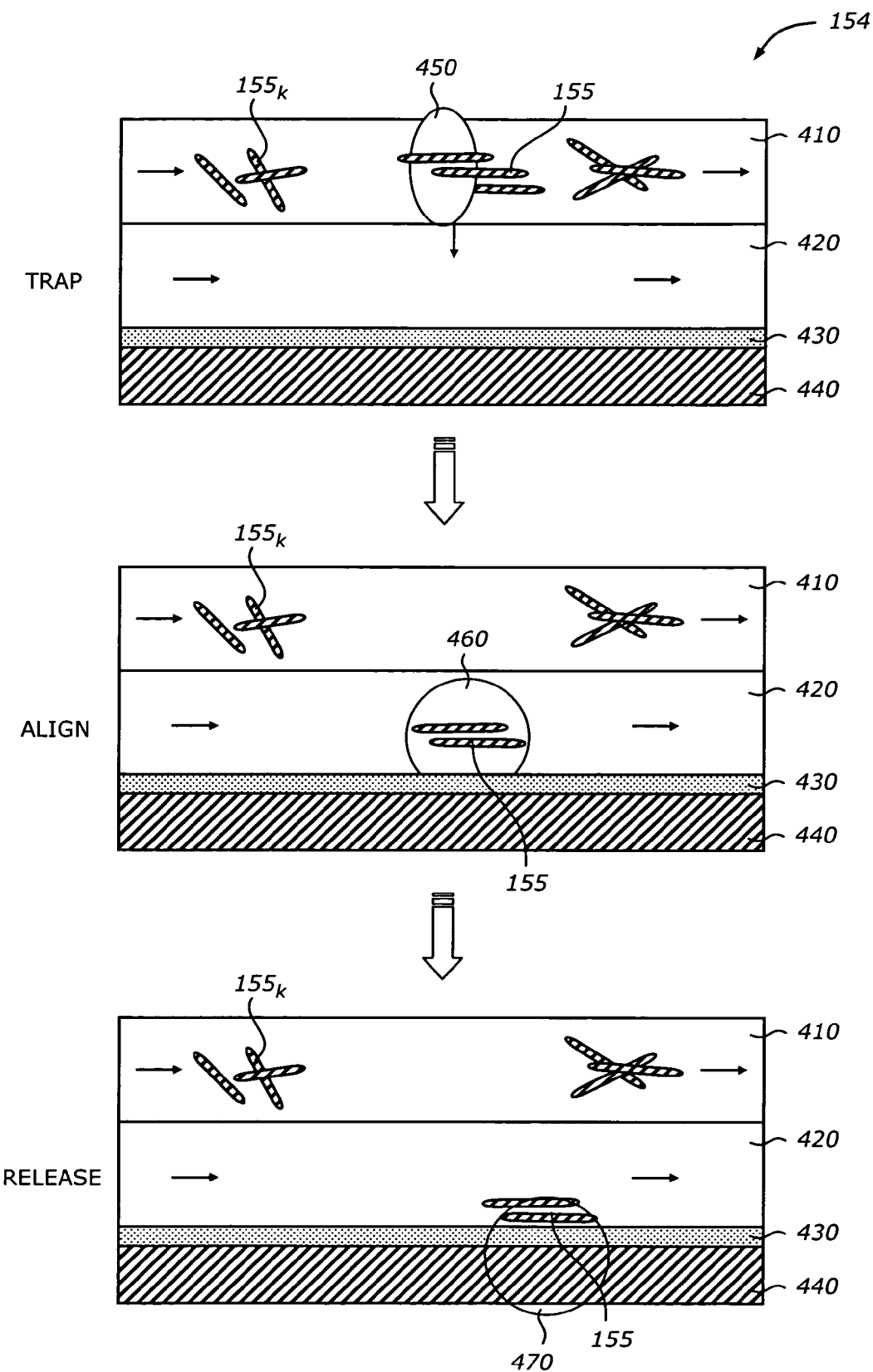
FIG. 4 is a diagram illustrating manipulation of CNTs using polarized laser beam according to one embodiment of the invention.

FIG. 4 is a diagram illustrating manipulation of CNTs using polarized laser beam according to one embodiment of the invention. The fluid 154 includes first, and second layers 410 and 420. A layer 440 is a solid substrate (e.g., glass, silicon). An adhesion layer 430 may be coated on the substrate 440.

The CNT 155 is trapped by the laser beam at a site 450 at the first layer 410. The CNT 155 is responsive to a polarization. The laser is a polarized laser. The CNT 155 is aligned to the orientation as provided by the polarized laser beam. The trapped CNT 155 is moved to a site 460 at the second layer 420 by changing the position of the laser focal point accordingly. The trapped CNT 155 is then released at the surface between the second layer 420 and the adhesion layer 430. The layer 430 provides support for the released CNT 155.

The layer 430 also immobilizes the CNT 155 while keeping its alignment or orientation the same as the laser polarization direction. The layer 430 can be patterned by lithography method to further define the location to where CNT 155 can attach.

If the trapped CNT 155 has high affinity with the surface of the substrate 440, the adhesion layer 430 is not necessary and the immobilization of the CNT 155 may be performed by the substrate layer 440.

The role of the second layer 420 is to prevent CNT from randomly diffusing on to the layer 430 or layer 440. If the CNT concentration in the first layer 410 is dilute enough that the non-specific binding on the surface 430 or 440 is negligible, the second layer 420 is not necessary.

The surface of the substrate layer 440 may be functionalized to immobilize the CNT 155 while keeping its alignment or orientation the same. This can be done by a number of ways. For example, the substrate layer 440 may be coated with a layer 430 of positively charged molecules (e.g. self-assembled 3-Aminopropyltriethoxysilane monolayer) that can bind to the CNT 155 or the functional group or chemical moiety on functionalized CNT 155 when it is near the surface.

The laser beam may sweep back and forth between the site 450 and a site 470 in the substrate layer 440 to trap, align, move, release, and deposit (immobilize) the CNT 155 on the substrate layer 440.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

The invention claimed is:

1. A method comprising:
    manipulating a carbon nanotube (CNT) in a fluid by a laser beam;
    aligning an illuminating light from a light source along axis of the CNT to produce an optical response from the CNT; and
    monitoring the CNT using an optical sensor to control the laser beam according to the optical response.

2. The method of claim 1 wherein manipulating comprises one of trapping the CNT, moving the trapped CNT, releasing the trapped CNT, aligning the trapped CNT by polarizing the laser beam, and immobilizing the CNT.

3. The method of claim 1 wherein aligning comprises:
    aligning the illuminating light from a halogen lamp along the axis of the CNT.

4. The method of claim 1 wherein aligning comprises:
    polarizing the illuminating light along the axis of the CNT.

5. The method of claim 1 wherein monitoring comprises:
    observing the optical response using the optical sensor coupled to a dark field microscope.

6. The method of claim 1 wherein the fluid includes a first layer on a solid substrate.

7. The method of claim 4 wherein polarizing comprises:
    polarizing the illuminating light along the axis of the CNT to produce a green light from Rayleigh scattering of the CNT.

8. The method of claim 7 wherein monitoring comprises:
    observing the green light using an optical sensor coupled to a dark field microscope.

9. The method of claim 5 wherein the optical sensor is one of a camera and a video recorder.

10. The method of claim 5 wherein monitoring further comprises:
    controlling the laser beam to affect manipulating of the CNT based on one of intensity and movement of the observed optical response.

11. The method of claim 10 wherein controlling the laser beam comprises one of varying frequency of the laser beam, changing position of focal point of the laser beam, turning off the laser beam, blocking the laser beam, filtering the laser beam to reduce laser intensity, moving the laser beam across a liquid-solid interface, and polarizing the laser beam.

12. The method of claim 6 further comprising coating the solid substrate with an adhesion layer.

13. The method of claim 12 wherein the fluid further includes a second layer between the first layer and the adhesion layer, the second layer preventing the CNT from randomly diffusing to the solid substrate or the adhesion layer.

14. The method of claim 12 further comprising functionalizing a surface of the solid substrate to immobilize the CNT.

15. An apparatus of comprising:
a laser to focus a laser beam to a carbon nanotube (CNT) in a fluid to perform a manipulation of the CNT;
a microscope to align an illuminating light from a light source along axis of the CNT to produce an optical response from the CNT, the microscope comprising a polarizer to align the illuminating light from a halogen lamp along the axis of the CNT; and
an optical sensor coupled to the microscope to monitor the CNT and control the laser beam according to the optical response;
wherein the polarizer polarizes the illuminating light along the axis of the CNT.

16. The apparatus of claim 15 wherein manipulation comprises one of trapping of the CNT, moving of the trapped CNT, releasing of the trapped CNT, aligning of the trapped CNT by polarizing the laser beam, and immobilizing of the CNT.

17. The apparatus of claim 15 wherein the polarizer polarizes the illuminating light along the axis of the CNT to produce a green light from Rayleigh scattering of the CNT.

18. The apparatus of claim 15 wherein the optical sensor allows observation of the optical response in a dark field configuration of the microscope.

19. The apparatus of claim 15 wherein the fluid includes a first layer on a solid substrate.

20. The apparatus of claim 17 wherein the optical sensor allows observation of the green light in a dark field configuration of the microscope.

21. The apparatus of claim 18 wherein the optical sensor is one of a camera and a video recorder.

22. The apparatus of claim 18 further comprises:
a controller to control the laser beam to affect manipulating of the CNT based on one of intensity and movement of the observed optical response.

23. The apparatus of claim 22 wherein the controller controls the laser beam by one of varying frequency of the laser beam, changing position of focal point of the laser beam, turning off the laser beam, blocking the laser beam, filtering the laser beam to reduce laser intensity, moving the laser beam across a liquid-solid interface, and polarizing the laser beam.

24. The apparatus of claim 19 wherein the solid substrate is coated by an adhesion layer.

25. The apparatus of claim 19 wherein the solid substrate has a surface functionalized to immobilize the CNT.

26. The apparatus of claim 24 wherein the fluid further includes a second layer between the first layer and the adhesion layer, the second layer preventing the CNT from randomly diffusing to the solid substrate or the adhesion layer.

27. A system comprising:
a light source to generate an illuminating light; and
a monitor coupled to the light source, the monitor comprising:
a laser to focus a laser beam to a carbon nanotube (CNT) in a fluid to perform a manipulation of the CNT,
a microscope to align the illuminating light along axis of the CNT to produce an optical response from the CNT, the microscope comprising a polarizer to align the illuminating light from a halogen lamp along the axis of the CNT, and
an optical sensor coupled to the microscope to monitor the CNT and control the laser beam according to the optical response;
wherein the polarizer polarizes the illuminating light along the axis of the CNT.

28. The system of claim 27 wherein manipulation comprises one of trapping of the CNT, moving of the trapped CNT, releasing of the trapped CNT, aligning of the trapped CNT by polarizing the laser beam, and immobilizing of the CNT.

29. The system of claim 27 wherein the polarizer polarizes the illuminating light along the axis of the CNT to produce a green light from Rayleigh scattering of the CNT.

30. The system of claim 27 wherein the optical sensor allows observation of the optical response in a dark field configuration of the microscope.

31. The system of claim 27 wherein the fluid includes a first layer on a solid substrate.

32. The system of claim 29 wherein the optical sensor allows observation of the green light in a dark field configuration of the microscope.

33. The system of claim 30 wherein the optical sensor is one of a camera and a video recorder.

34. The system of claim 30 wherein the monitor further comprises:
a controller to control the laser beam to affect manipulating of the CNT based on one of intensity and movement of the observed optical response.

35. The system of claim 34 wherein the controller controls the laser beam by one of varying frequency of the laser beam, changing position of focal point of the laser beam, turning off the laser beam, blocking the laser beam, filtering the laser beam to reduce laser intensity, moving the laser beam across a liquid-solid interface, and polarizing the laser beam.

36. The system of claim 31 wherein the solid substrate is coated by an adhesion layer.

37. The system of claim 36 wherein the fluid further includes a second layer between the first layer and the adhesion layer, the second layer preventing the CNT from randomly diffusing to the solid substrate or the adhesion layer.

38. The system of claim 36 wherein the solid substrate has a surface functionalized to immobilize the CNT.

* * * * *

UNITED STATES PATENT AND TRADEMARK OFFICE
CERTIFICATE OF CORRECTION

PATENT NO.       : 7,315,374 B2
APPLICATION NO.  : 10/876429
DATED            : January 1, 2008
INVENTOR(S)      : Tan et al.

It is certified that error appears in the above-identified patent and that said Letters Patent is hereby corrected as shown below:

In column 7, at line 13 claim 15, after "apparatus", remove "of".

Signed and Sealed this

Fifth Day of August, 2008

JON W. DUDAS
*Director of the United States Patent and Trademark Office*